US009161450B2

(12) United States Patent
Kamakura

(10) Patent No.: US 9,161,450 B2
(45) Date of Patent: Oct. 13, 2015

(54) ELECTRONIC DEVICE, ELECTRONIC APPARATUS, AND METHOD OF MANUFACTURING ELECTRONIC DEVICE

(71) Applicant: Seiko Epson Corporation, Tokyo (JP)

(72) Inventor: Tomoyuki Kamakura, Matsumoto (JP)

(73) Assignee: Seiko Epson Corporation (JP)

( * ) Notice: Subject to any disclaimer, the term of this patent is extended or adjusted under 35 U.S.C. 154(b) by 169 days.

(21) Appl. No.: 13/857,220

(22) Filed: Apr. 5, 2013

(65) Prior Publication Data
US 2013/0264109 A1  Oct. 10, 2013

(30) Foreign Application Priority Data
Apr. 10, 2012  (JP) ................... 2012-089669

(51) Int. Cl.
| | |
|---|---|
| H01L 41/00 | (2013.01) |
| H01R 13/46 | (2006.01) |
| H05K 1/18 | (2006.01) |
| H05K 3/30 | (2006.01) |
| H05K 1/11 | (2006.01) |
| H03H 9/05 | (2006.01) |
| H05K 3/32 | (2006.01) |
| H03H 9/10 | (2006.01) |

(52) U.S. Cl.
CPC .......... *H05K 1/181* (2013.01); *H03H 9/0504* (2013.01); *H05K 1/113* (2013.01); *H05K 3/301* (2013.01); *H01L 2224/16225* (2013.01); *H03H 9/0509* (2013.01); *H03H 9/1021* (2013.01); *H05K 3/321* (2013.01); *H05K 2201/10083* (2013.01); *H05K 2201/10371* (2013.01); *H05K 2203/1147* (2013.01); *Y10T 29/4913* (2015.01)

(58) Field of Classification Search
CPC .. H03H 9/1021; H03H 9/0519; H03H 9/0509
USPC .................. 174/520; 310/318, 319, 340, 363
See application file for complete search history.

(56) References Cited

U.S. PATENT DOCUMENTS

| | | | | |
|---|---|---|---|---|
| 5,699,027 A | * | 12/1997 | Tsuji et al. .................... | 333/193 |
| 6,078,123 A | * | 6/2000 | Tanaka et al. ............. | 310/313 R |
| 6,229,404 B1 | * | 5/2001 | Hatanaka ........................ | 331/68 |
| 6,369,673 B1 | * | 4/2002 | Kondo et al. ................. | 333/193 |
| 6,452,311 B1 | * | 9/2002 | Serizawa ....................... | 310/363 |
| 6,507,139 B1 | * | 1/2003 | Ishino et al. .................. | 310/348 |
| 6,700,313 B2 | * | 3/2004 | Dalla Piazza et al. ........ | 310/370 |
| 7,015,627 B2 | * | 3/2006 | Serizawa ...................... | 310/340 |
| 7,095,161 B2 | * | 8/2006 | Unno et al. ................... | 310/348 |
| 7,923,904 B2 | * | 4/2011 | Takeuchi et al. ............. | 310/340 |
| 8,004,157 B2 | * | 8/2011 | Iizuka et al. .................. | 310/344 |

(Continued)

FOREIGN PATENT DOCUMENTS

| | | |
|---|---|---|
| JP | 2003-179456 A | 6/2003 |
| JP | 2004-015563 A | 1/2004 |

(Continued)

*Primary Examiner* — Jeremy C Norris
*Assistant Examiner* — Nathan Milakovich
(74) *Attorney, Agent, or Firm* — Harness, Dickey & Pierce, P.L.C.

(57) ABSTRACT

An electronic device has a vibrating element and a package accommodating the vibrating element. Moreover, the package has through-electrodes formed to penetrate a base substrate in its thickness direction and electrically connected with connection terminals, and electrically conductive adhesives (covering members) formed above the connection terminals so as to contain the through-electrodes.

9 Claims, 17 Drawing Sheets

(56) References Cited

U.S. PATENT DOCUMENTS

| | | | |
|---|---|---|---|
| 8,093,785 B2* | 1/2012 | Wada | 310/340 |
| 8,531,092 B2* | 9/2013 | Ichikawa et al. | 310/364 |
| 8,653,899 B2* | 2/2014 | Aratake | 331/156 |
| 8,729,777 B2* | 5/2014 | Kubota et al. | 310/348 |
| 2002/0158699 A1* | 10/2002 | Iizuka et al. | 331/158 |
| 2010/0123369 A1* | 5/2010 | Ono et al. | 310/348 |
| 2010/0308928 A1* | 12/2010 | Aratake et al. | 331/116 R |
| 2011/0050044 A1 | 3/2011 | Funabiki et al. | |
| 2011/0187472 A1 | 8/2011 | Fukuda | |
| 2011/0228643 A1* | 9/2011 | Aratake | 368/47 |
| 2011/0261658 A1* | 10/2011 | Funabiki et al. | 368/47 |
| 2012/0044025 A1* | 2/2012 | Nakamura et al. | 331/158 |
| 2012/0153779 A1* | 6/2012 | Sato et al. | 310/344 |
| 2012/0225197 A1* | 9/2012 | Ebigase | 427/77 |
| 2013/0077449 A1* | 3/2013 | Aratake | 368/47 |
| 2013/0082574 A1* | 4/2013 | Arimatsu | 310/348 |
| 2013/0208573 A1* | 8/2013 | Arimatsu | 368/47 |
| 2013/0245755 A1* | 9/2013 | Fehr et al. | 623/6.22 |
| 2013/0250520 A1* | 9/2013 | Taniguchi | 361/707 |
| 2014/0078870 A1* | 3/2014 | Kobayashi | 368/47 |
| 2014/0111919 A1* | 4/2014 | Miyasaka et al. | 361/679.01 |
| 2014/0203688 A1* | 7/2014 | Kozuki | 310/344 |
| 2014/0204541 A1* | 7/2014 | Kozuki | 361/748 |
| 2014/0291010 A1* | 10/2014 | Chiba | 174/520 |

FOREIGN PATENT DOCUMENTS

| | | | |
|---|---|---|---|
| JP | 2004214787 A | | 7/2004 |
| JP | 2008-193180 A | | 8/2008 |
| JP | 2009194859 A | | 8/2009 |
| JP | 2010057081 A | * | 3/2010 |
| JP | 2011049664 A | | 3/2011 |
| JP | 2011-160350 A | | 8/2011 |
| JP | 2011155506 A | * | 8/2011 |

* cited by examiner

ELECTRONIC DEVICE, ELECTRONIC APPARATUS, AND METHOD OF MANUFACTURING ELECTRONIC DEVICE

BACKGROUND

1. Technical Field

The present invention relates to an electronic device, an electronic apparatus, and a method of manufacturing an electronic device.

2. Related Art

In the related art, electronic devices comprising an electronic component such as a vibrating element accommodated in a package have been known. Moreover, as the package, a configuration comprising a base substrate and a lid (lid portion) bonded together via a bonding member such as a brazing material has been known.

In the package, a connection terminal formed on an upper surface (inner surface) of the base substrate and electrically connected with the vibrating element, a mounting terminal formed on a lower surface (outer surface) of the base substrate, and a through-electrode formed to penetrate the base substrate and electrically connecting the connection terminal with the mounting terminal are disposed. The package is airtightly sealed for purposes of improving vibration characteristics of the vibrating element, or the like.

However, since the through-electrode is formed by burying an electrically conductive material such as a metal in a through-hole formed in the base substrate, the flow of gas inside and outside the package is generated from a gap formed between an inner circumferential surface of the through-hole and the through-electrode or a gap formed in the through-electrode for example, leading to a problem that airtightness cannot be ensured.

For solving such a problem, in an electronic device disclosed in JP-A-2003-179456, a through-electrode (through-hole) is formed in a region of a base substrate, where the region overlaps with an opening edge surface of a lid, and the through-electrode is configured so as to be covered with glass (bonding member) bonding the base substrate with the lid. In recent years, however, a further reduction in size of electronic devices has been desired. With this desire, the width of an opening edge surface of a lid is also reduced. Therefore, it is difficult to form a through-electrode at the portion, and moreover, the through-electrode sometimes protrudes from the portion due to manufacturing variations. Further, since the through-electrode is formed just below the glass (bonding member), the through-electrode is damaged by heat applied in bonding of the lid to the base substrate.

In this manner, the electronic device of JP-A-2003-179456 has a problem that the airtightness of an accommodating space cannot be improved while achieving a reduction in the electronic device.

SUMMARY

An advantage of some aspects of the invention is to provide an electronic device capable of improving the airtightness of an accommodating space while achieving a reduction in size, an electronic apparatus comprising high reliability and including the electronic device, and a method of manufacturing an electronic device comprising high reliability.

The invention can be implemented as the following modes or application examples.

Application Example 1

An electronic device according to this application example of the invention includes: an electronic component; a base substrate comprising the electronic component fixed above one of surface sides; a lid portion bonded to the base substrate so as to cover the electronic component; a connection terminal formed above a surface of the base substrate above the electronic component side and electrically connected with the electronic component; a through-electrode formed to penetrate the base substrate in a thickness direction thereof and electrically connected with the connection terminal; and a covering member formed above the connection terminal so as to contain the through-electrode in plan view of the base substrate.

With this configuration, the electronic device capable of improving the airtightness of an accommodating space while achieving a reduction in size is obtained.

Application Example 2

In the electronic device according to the application example of the invention, it is preferable that the covering member further covers at least a portion of a side surface of the connection terminal.

With this configuration, the airtightness of the accommodating space is more improved.

Application Example 3

In the electronic device according to the application example of the invention, it is preferable that the covering member covers at least a side surface of the connection terminal, where a spaced-apart distance between the side surface and the through-electrode is shortest.

With this configuration, the airtightness of the accommodating space is more improved.

Application Example 4

In the electronic device according to the application example of the invention, it is preferable that the electronic component is fixed to the base substrate via the covering member.

With this configuration, the number of parts can be reduced, so that a reduction in size of the electronic device can be achieved.

Application Example 5

In the electronic device according to the application example of the invention, it is preferable that the connection terminal and the electronic component are electrically connected via the covering member comprising electrical conductivity.

With this configuration, the number of parts can be reduced, so that a reduction in size of the electronic device can be achieved.

Application Example 6

In the electronic device according to the application example of the invention, it is preferable that the electronic device further includes a wire electrically connecting the connection terminal with the electronic component.

With this configuration, an electrical connection between the vibrating element and the connection terminal can be reliably performed.

Application Example 7

An electronic apparatus according to this application example of the invention includes the electronic device according to the application example of the invention.

With this configuration, the electronic apparatus comprising high reliability is obtained.

Application Example 8

A method of manufacturing an electronic device according to this application example of the invention includes: preparing a base substrate formed with a connection terminal and a through-electrode that penetrates in a thickness direction and is electrically connected with the connection terminal; arranging a covering member on the connection terminal; fixing an electronic component above the base substrate via the covering member; and bonding a lid portion to the base substrate so as to cover the electronic component, wherein in the fixing of the electronic component above the base substrate, the covering member contains an end of the through-electrode on the connection terminal side in plan view of the base substrate.

With this configuration, the electronic device capable of improving the airtightness of the accommodating space while achieving a reduction in size is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, electronic devices, a method of manufacturing an electronic device, and electronic apparatuses will be described in detail based on preferred embodiments shown in the accompanying drawings.

First Embodiment

Figure 1:
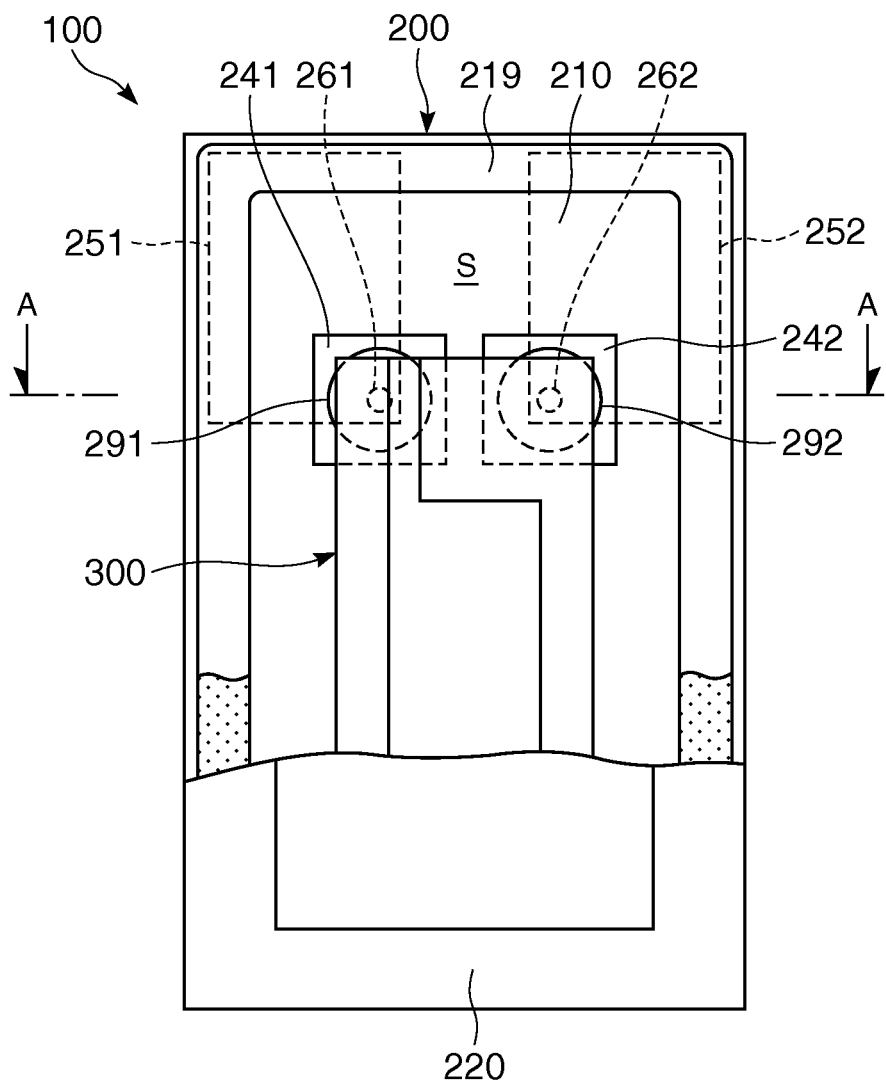
FIG. 1 is a plan view of an electronic device according to a first embodiment of the invention.
Figure 2:
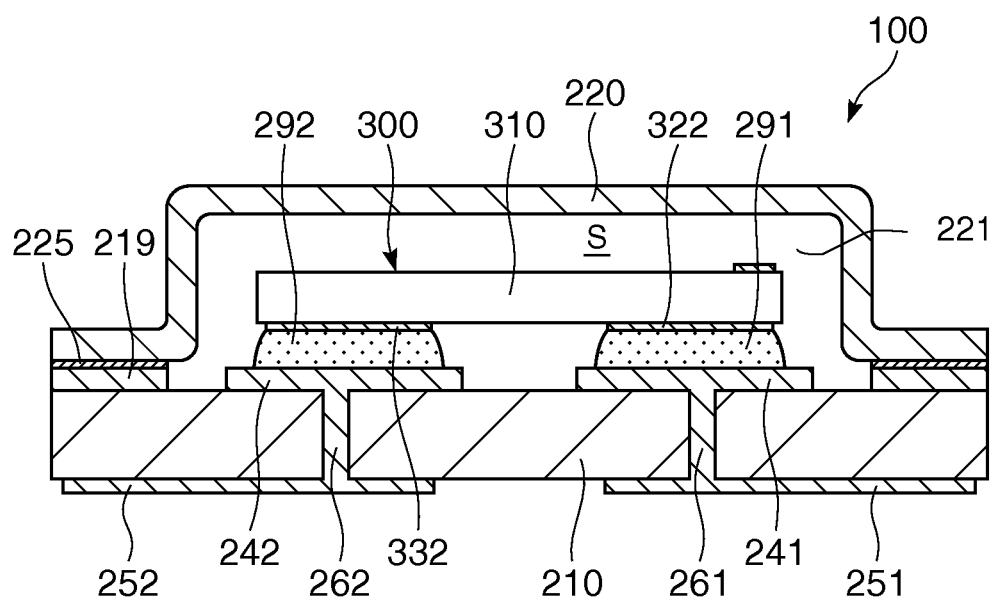
FIG. 2 is a cross-sectional view of the electronic device shown in FIG. 1.
Figure 3A:
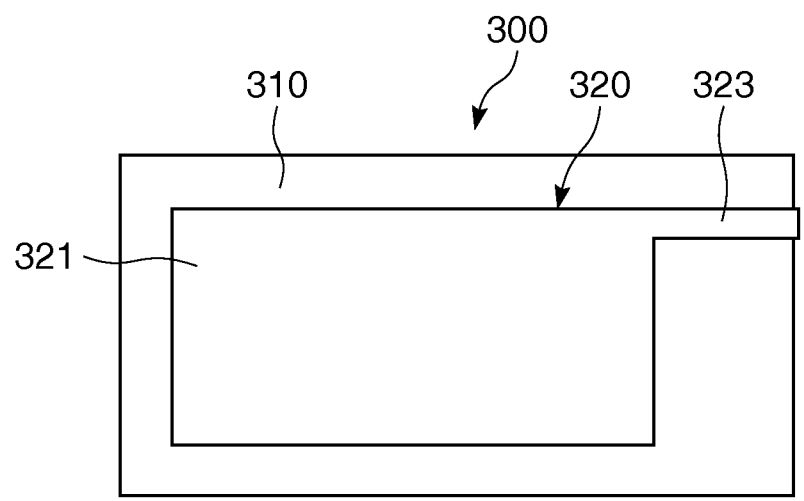
FIGS. 3A and 3B are plan views of a vibrating element of the electronic device shown in FIG. 1.
Figure 3B:
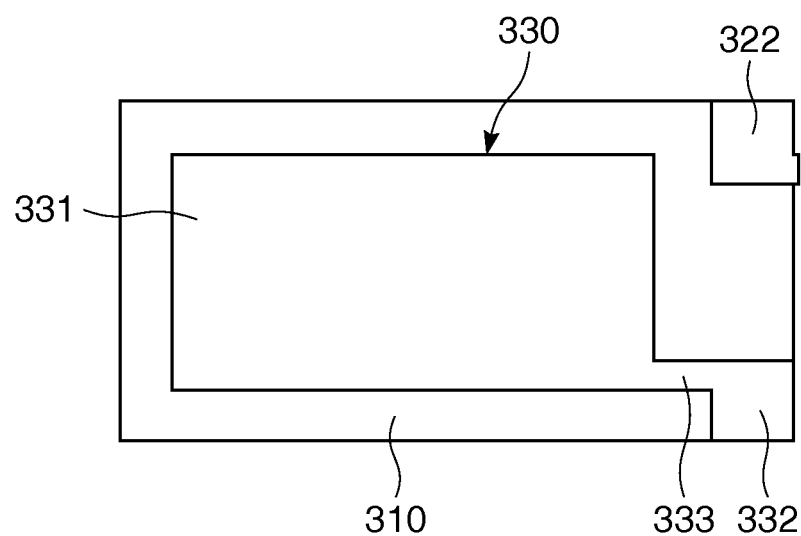
Figure 4:
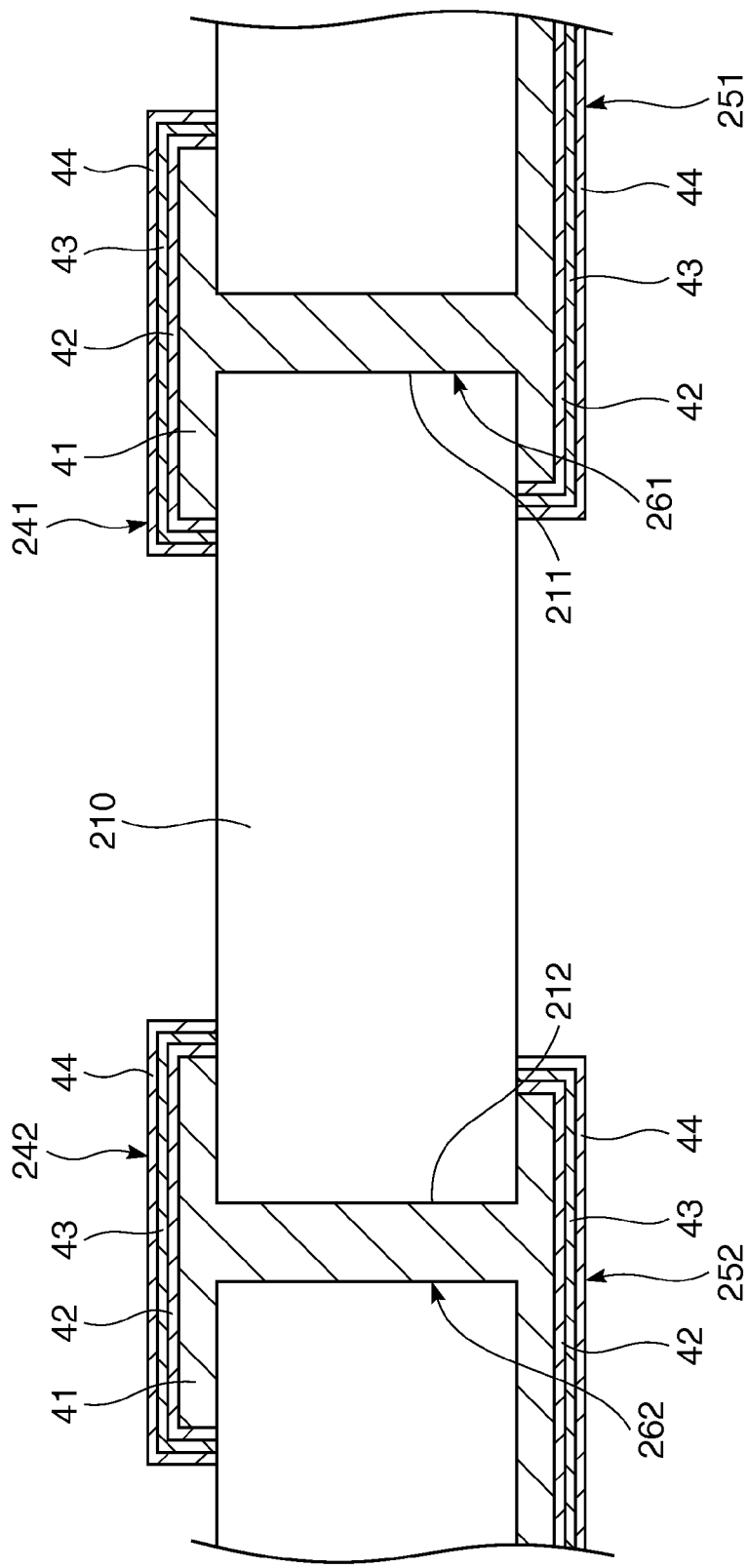
FIG. 4 is a partially enlarged view of the cross section shown in FIG. 2.

FIG. 1 is a plan view of an electronic device according to a first embodiment of the invention; FIG. 2 is a cross-sectional view of the electronic device shown in FIG. 1; FIGS. 3A and 3B are plan views of a vibrating element of the electronic device shown in FIG. 1; FIG. 4 is a partially enlarged view of the cross section shown in FIG. 2; and FIGS. 5A to 6C explain a method of manufacturing the electronic device shown in FIG. 1. In the following description, the upside in FIGS. 2 and 4 to 6C is defined as "top", and the downside is defined as "bottom" for convenience of description.

1. Electronic Device

First, the electronic device of the embodiment of the invention will be described.

As shown in FIGS. 1 and 2, the electronic device 100 has a package 200 and a vibrating element 300 as an electronic component accommodated in the package 200.

Vibrating Element

FIG. 3A is a plan view of the vibrating element 300 as viewed from above; and FIG. 3B is a see-through view (plan view) of the vibrating element 300 as viewed from above. As shown in FIGS. 3A and 3B, the vibrating element 300 has a piezoelectric substrate 310 comprising an oblong (rectangular) plate-like shape in plan view and a pair of excitation electrodes 320 and 330 formed on surfaces of the piezoelectric substrate 310.

The piezoelectric substrate 310 is a quartz crystal blank that mainly performs thickness-shear vibration. In the embodiment, a quartz crystal blank that is cut at a cut angle called AT-cut is used as the piezoelectric substrate 310. The AT-cut means to cut a quartz crystal blank so as to have a principal surface (principal surface including an X-axis and a Z'-axis) obtained by rotating a plane (Y-plane) including the X-axis and a Z-axis as the crystal axes of quartz crystal about the X-axis in the counterclockwise direction by an angle of about 35 degrees and 15 minutes from the Z-axis.

A longitudinal direction of the piezoelectric substrate 310 comprising the configuration described above coincides with the X-axis as the crystal axis of quartz crystal.

The excitation electrode 320 has an electrode portion 321 formed on an upper surface of the piezoelectric substrate 310, a bonding pad 322 formed on a lower surface of the piezoelectric substrate 310, and a wiring 323 electrically connecting the electrode portion 321 with the bonding pad 322.

On the other hand, the excitation electrode 330 has an electrode portion 331 formed on the lower surface of the piezoelectric substrate 310, a bonding pad 332 formed on the lower surface of the piezoelectric substrate 310, and a wiring 333 electrically connecting the electrode portion 331 with the bonding pad 332.

The electrode portions 321 and 331 are disposed to face each other via the piezoelectric substrate 310 and have substantially the same shape. That is, in plan view of the piezoelectric substrate 310, the electrode portions 321 and 331 are located so as to overlap with each other and formed so as to coincide in outline with each other. Moreover, the bonding pads 322 and 332 are formed spaced apart from each other at right ends, in FIGS. 3A and 3B, on the lower surface of the piezoelectric substrate 310.

The excitation electrodes 320 and 330 can be formed by, for example, depositing an under layer of nickel (Ni) or chromium (Cr) on the piezoelectric substrate 310 by vapor deposition or sputtering, depositing an electrode layer of gold (Au) on the under layer by vapor deposition or sputtering, and then patterning into a desired shape using photolithography and various kinds of etching techniques. With the formation of the under layer, the adhesion between the piezoelectric substrate 310 and the electrode layer is improved, so that the vibrating element 300 with high reliability is obtained.

The configurations of the excitation electrodes 320 and 330 are not limited to the configurations described above. For example, the under layer may be omitted, or the constituent material of the excitation electrodes 320 and 330 may be another material comprising electrical conductivity (for example, various kinds of metal materials such as silver (Ag), copper (Cu), tungsten (W), or molybdenum (Mo)).

Although the vibrating element 300 has been described so far, the configuration of the vibrating element 300 is not limited to this. For example, the vibrating element 300 may be a vibrator, a gyro sensor, or the like comprising a shape in which a plurality of vibrating arms extend from a base portion.

Package

As shown in FIGS. 1 and 2, the package 200 has a plate-like base substrate 210, a cap-like lid (lid portion) 220 comprising a recess 221 that is opened on the lower side, connection terminals 241 and 242 formed on an upper surface (inner surface) of the base substrate 210, mounting terminals 251 and 252 formed on a lower surface (outer surface) of the base substrate 210, and through-electrodes 261 and 262 formed to penetrate the base substrate 210 and electrically connecting the connection terminals 241 and 242 with the mounting terminals 251 and 252. In the package 200, an opening of the recess 221 of the lid 220 is closed by the base substrate 210, whereby an accommodating space S for accommodating the vibrating element 300 is formed.

The shape of both of the base substrate 210 and the lid 220 in plan view is substantially an oblong (rectangle). However, the shape of the base substrate 210 and the lid 220 in plan view is not particularly limited, and may be, for example, a circle or the like.

A frame-like metallization layer 219 is formed at an edge portion of the upper surface of the base substrate 210. The constituent material of the metallization layer is not particularly limited, and a metal material such as, for example, tungsten (W), molybdenum (Mo), manganese (Mn), copper (Cu), silver (Ag), palladium (Pd), gold (Au), or platinum (Pt) can be used.

The lid 220 has the recess 221 that is opened on the lower side (the base substrate 210 side). The lid 220 is bonded to the metallization layer 219 via a brazing material 225 such as silver solder. A method of bonding the base substrate 210 with the lid 220 is not limited to the bonding of the metallization layer 219 with the brazing material 225, and the base substrate 210 and the lid 220 may be bonded together using, for example, a low melting point glass or the like.

The constituent material of the base substrate 210 is not particularly limited as long as it has an insulating property. For example, various kinds of ceramics such as oxide-based ceramics, nitride-based ceramics, or carbide-based ceramics can be used. Moreover, the constituent material of the lid 220 is not particularly limited and preferably a member whose linear expansion coefficient approximates that of the constituent material of the base substrate 210. For example, when the ceramics described above are used as the constituent material of the base substrate 210, an alloy such as Kovar is preferably used.

As shown in FIG. 2, the pair of connection terminals 241 and 242 are formed on the upper surface (surface facing the accommodating space S) of the base substrate 210. Moreover, the pair of mounting terminals 251 and 252 for drawing the connection terminals 241 and 242 to the outside of the package 200 are formed on the lower surface of the base substrate 210. The connection terminal 241 and the mounting terminal 251 are electrically connected through the through-electrode 261 formed to penetrate the base substrate 210. Similarly, the connection terminal 242 and the mounting terminal 252 are electrically connected through the through-electrode 262 formed to penetrate the base substrate 210.

The vibrating element 300 is accommodated in the accommodating space S. The vibrating element 300 accommodated in the accommodating space S is supported in a cantilever fashion by the base substrate 210 via a pair of electrically conductive adhesives 291 and 292.

The electrically conductive adhesive 291 is disposed in contact with the connection terminal 241 and the bonding pad 322. With this configuration, the connection terminal 241 and the bonding pad 322 are electrically connected via the electrically conductive adhesive 291. Similarly, the electrically conductive adhesive 292 is disposed in contact with the connection terminal 242 and the bonding pad 332. With this configuration, the connection terminal 242 and the bonding pad 332 are electrically connected via the electrically conductive adhesive 292.

The electrically conductive adhesives 291 and 292 are not particularly limited as long as they can fix the vibrating element 300 to the base substrate 210 and have electrical conductivity. For example, a silver paste (for example, one obtained by dispersing silver particles in an epoxy resin-based adhesive), a copper paste, or the like can be preferably used, and a silver paste is preferably used from the viewpoints of oxidation resistance and low resistance.

Here, although described also in a method of manufacturing the electronic device 100 described later, specific configurations and manufacturing processes of the connection terminals 241 and 242, the mounting terminals 251 and 252, and the through-electrodes 261 and 262 will be described. The configurations shown below are illustrative only, and the configurations of the connection terminals 241 and 242, the mounting terminals 251 and 252, and the through-electrodes 261 and 262 are not limited to the following configurations.

As shown in FIG. 4, through-holes 211 and 212 penetrating in a thickness direction of the base substrate 210 are formed in the base substrate 210. The diameter of the through-holes 211 and 212 is not particularly limited, and may be, for example, about from 50 μm to 100 μm.

Then, a first metal layer 41 is formed so as to fill the through-holes 211 and 212 and spread over the upper surface and the lower surface. The formation of the first metal layer 41 is performed as follows. First, for example, a metal ink obtained by mixing a binder and a raw material powder containing a metal powder such as of molybdenum (Mo) or tungsten (W) and a glass powder is applied, by a screen printing method or the like, in the shapes of the connection terminals 241 and 242 from the upper surface side of the base substrate 210, and applied in the shapes of the mounting terminals 251 and 252 from the lower surface side. In this case, portions of the metal ink enter the through-holes 211 and 212, so that the through-holes 211 and 212 are filled with the metal ink. Next, the metal ink is baked to thereby obtain the first metal layer 41. Since a glass powder is contained in the metal ink as described above, the first metal layer 41 excellent in adhesion to the base substrate 210 (ceramic substrate) containing a glass component is obtained.

Further, a second metal layer 42 is formed so as to cover the first metal layer 41. The second metal layer 42 is, for example, a plated film formed by an electroless Ni—B-based alloy plating process. A process for enhancing adhesion between the first metal layer 41 and the second metal layer 42 may be performed by heating the second metal layer 42 to cause mutual diffuse between the second metal layer 42 and the first metal layer 41. Further, a third metal layer 43 is formed so as to cover the second metal layer 42. The third metal layer 43 is, for example, a plated film formed by an electroless Ni—P-based alloy plating process. Further, a fourth metal layer 44 is formed so as to cover the third metal layer 43. The fourth metal layer 44 is, for example, a plated film formed by an electroless gold plating process and functions as an anti-oxidation film.

With the first to fourth metal layers 41 to 44, the connection terminals 241 and 242, the mounting terminals 251 and 252, and the through-electrodes 261 and 262 are formed.

Here, since the first metal layer 41 is a sintered body of metal powders (metal particles), an air bubble such as a void is easily formed between particles. Therefore, the inside and outside of the accommodating space S communicate with each other via the air bubble to cause a risk of lowering the airtightness of the accommodating space S. Moreover, also in regard to the second to fourth metal layers 42 to 44 covering the first metal layer 41, gas can pass through the film depending on the thickness or orientation thereof. Therefore, it is difficult to keep the airtightness of the accommodating space S.

Therefore, in the electronic device 100 as shown in FIG. 1, the electrically conductive adhesive 291 is formed above the connection terminal 241 so as to contain, that is, so as to cover the through-electrode 261 (the through-hole 211) in plan view of the base substrate 210. Similarly, the electrically conductive adhesive 292 is formed above the connection terminal 242 so as to contain the through-electrode 262 (the through-hole 212). With this configuration, the through-electrodes 261 and 262 can be covered with "lid" using the electrically conductive adhesives 291 and 292. Therefore, it is possible to suppress the flow (flow in and flow out) of gas of the accommodating space S via the through-electrodes 261 and 262, so that the airtightness of the accommodating space S is improved.

Especially, since the electrically conductive adhesives 291 and 292 also function as covering members formed above the connection terminals 241 and 242 so as to contain the through-electrodes 261 and 262 as in the embodiment, there is no need to separately form a covering member. Therefore, a reduction in the number of members can be achieved, so that reductions in size and cost can be achieved. Further, the electrically conductive adhesives 291 and 292 function as fixing members that fix the vibrating element 300 to the base substrate 210, and, at the same time, have also a function of electrically connecting the connection terminals 241 and 242 with the bonding pads 322 and 332. Therefore, for example, there is no need to separately dispose a member that fixes the vibrating element 300 to the base substrate 210 and a member that electrically connects the connection terminals 241 and 242 with the bonding pads 322 and 332, so that further reductions in size and cost of the electronic device 100 can be achieved.

2. Method for Manufacturing Electronic Device

Next, a method of manufacturing the electronic device 100 will be described.

The method of manufacturing the electronic device 100 has a first step, a second step, a third step, and a fourth step. In the first step, the base substrate 210 formed with the metallization layer 219, the connection terminals 241 and 242, the mounting terminals 251 and 252, and the through-electrodes 261 and 262 is prepared. In the second step, the electrically conductive adhesives 291 and 292 are arranged on the connection terminals 241 and 242. In the third step, the vibrating element 300 is fixed above the base substrate 210 via the electrically conductive adhesives 291 and 292. In the fourth step, the lid 220 is bonded to the base substrate 210 so as to cover the vibrating element 300. Hereinafter, each of the steps will be described in detail.

First Step

Figure 5A:
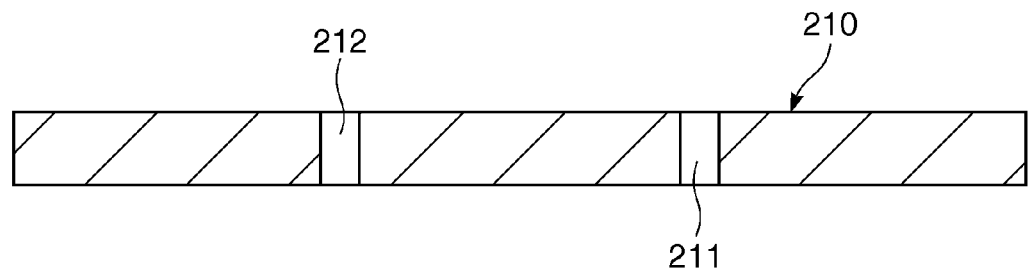
FIGS. 5A to 5C explain a method of manufacturing the electronic device shown in FIG. 1.

First, as shown in FIG. 5A, the plate-like base substrate 210 is prepared. The base substrate 210 is obtained by forming a mixture of a raw material powder comprising ceramics or glass, an organic solvent, and a binder into a sheet shape by a doctor blade method or the like to obtain a ceramic green sheet, baking the obtained ceramic green sheet, and then forming the through-holes 211 and 212 at necessary portions. In this case, it is preferable that the ceramic green sheet is a single layer. With this configuration, a reduction in manufacturing cost can be achieved.

Figure 5B:
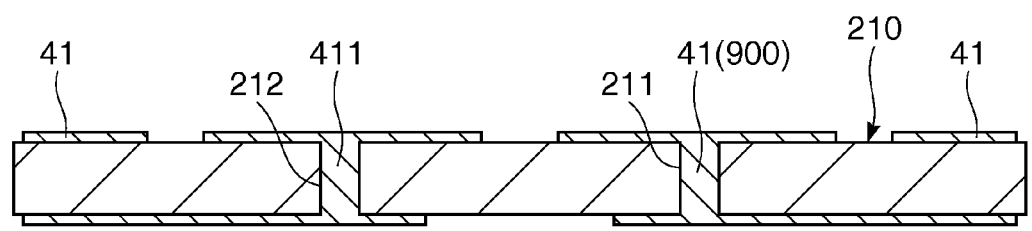
Figure 5C:
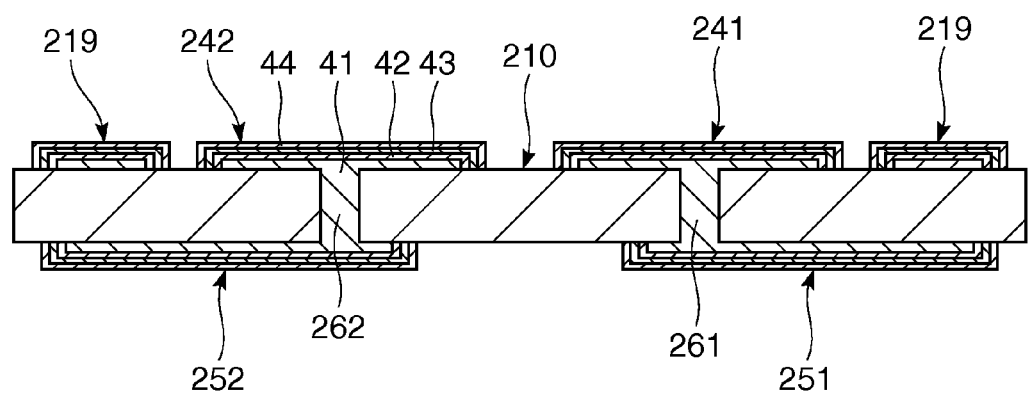

Next, a metal ink 900 obtained by mixing a binder with a raw material powder containing a metal powder such as of, for example, molybdenum (Mo) or tungsten (W) and a glass powder is prepared, and as shown in FIG. 5B, the metal ink 900 is applied, on the upper and lower surfaces of the base substrate 210, in regions where the metallization layer 219, the connection terminals 241 and 242, and the mounting terminals 251 and 252 are to be formed. In this case, the metal ink 900 enters into the through-holes 211 and 212, so that the through-holes 211 and 212 are filled with the metal ink 900. Although the method of applying the metal ink 900 is not particularly limited, the use of screen printing is preferable.

Next, the metal ink 900 applied to the base substrate 210 is baked to form the first metal layer 41. As described above, since a glass powder is contained in the metal ink 900, the metal ink 900 is excellent in compatibility (affinity) with the base substrate 210 containing a glass component, and thus adhesion between the first metal layer 41 and the base substrate 210 can be enhanced.

Next, plating is applied by an electroless Ni—B-based alloy plating process to thereby form the second metal layer 42 on the first metal layer 41. In this manner, with the use of an electroless plating process, the second metal layer 42 can be formed so as to cover the entire surface region (that is, an upper surface and side surfaces) of the first metal layer 41. Next, the second metal layer 42 is heated to cause mutual diffusion between the second metal layer 42 and the first metal layer 41, so that adhesion between the first metal layer 41 and the second metal layer 42 is enhanced (a sintering process is performed).

Next, plating is applied by an electroless Ni—P-based alloy plating process to thereby form the third metal layer 43 on the second metal layer 42. In this manner, with the use of an electroless plating process, the third metal layer 43 can be formed so as to cover the entire surface region (that is, an upper surface and side surfaces) of the second metal layer 42.

Next, plating is applied by an electroless gold plating process to thereby form the fourth metal layer 44 on the third metal layer 43. In this manner, with the use of an electroless plating process, the fourth metal layer 44 can be formed so as to cover the entire surface region (that is, an upper surface and side surfaces) of the third metal layer 43. The fourth metal layer 44 has a function as an anti-oxidation film that prevents oxidation of the first to third metal layers 41 to 43.

Through the step described above, as shown in FIG. 5C, the base substrate 210 formed with the metallization layer 219, the connection terminals 241 and 242, the mounting terminals 251 and 252, and the through-electrodes 261 and 262 is obtained.

Second Step

Figure 6A:
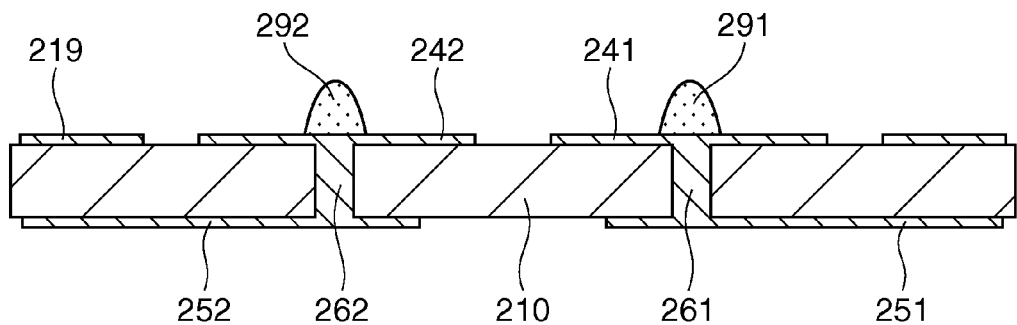
FIGS. 6A to 6C explain the method of manufacturing the electronic device shown in FIG. 1.

Next, as shown in FIG. 6A, the electrically conductive adhesives 291 and 292 are applied on the connection terminals 241 and 242. As the electrically conductive adhesives 291 and 292, a silver paste (adhesive containing silver particles) is preferably used from the viewpoint of oxidation prevention or low resistance. In this case, the electrically conductive adhesives 291 and 292 are arranged at least in the vicinities of the through-holes 211 and 212 (the through-electrodes 261 and 262) in plan view of the base substrate 210, and preferably arranged so as to overlap with the through-holes 211 and 212. Moreover, the electrically conductive adhesives 291 and 292 are arranged spaced apart from each other.

Third Step

Next, the vibrating element 300 is placed on the electrically conductive adhesives 291 and 292 so as to be substantially parallel to the base substrate 210 to bring the electrically conductive adhesives 291 and 292 and the bonding pads 322 and 332 into contact with each other. Further, the vibrating element 300 is pressed toward the base substrate 210 side while maintaining parallelism between the base substrate 210 and the vibrating element 300.

Figure 6B:
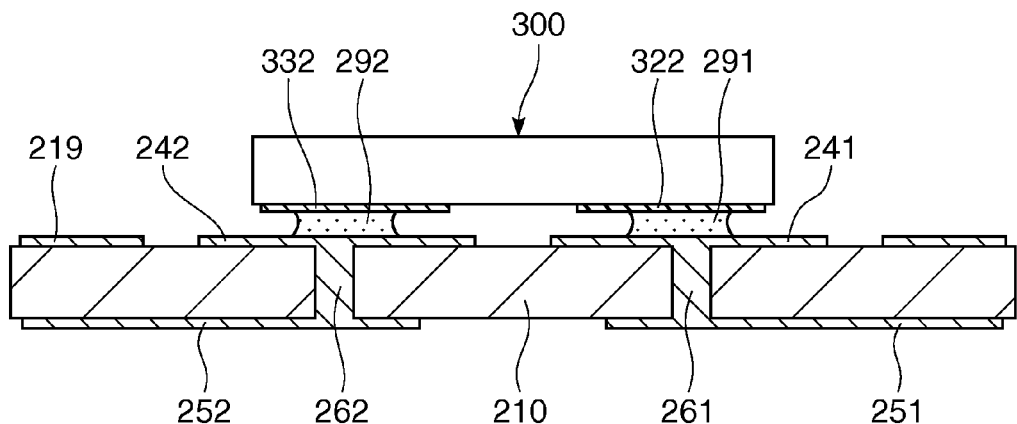

Thus, as shown in FIG. 6B, the vibrating element 300 is fixed to the base substrate 210 via the electrically conductive adhesives 291 and 292. Moreover, by pressing the vibrating element 300 toward the base substrate 210 side, the electrically conductive adhesives 291 and 292 are crushed and spread, whereby in plan view of the base substrate 210, the electrically conductive adhesive 291 is deformed so as to contain (cover) the through-hole 211 and the electrically conductive adhesive 292 is deformed so as to contain the through-hole 212.

In the second step, at the time of applying the electrically conductive adhesives 291 and 292 on the connection terminals 241 and 242, the electrically conductive adhesive 291 may contain the through-hole 211, and the electrically conductive adhesive 292 may contain the through-hole 212, in plan view of the base substrate 210.

Fourth Step

Figure 6C:
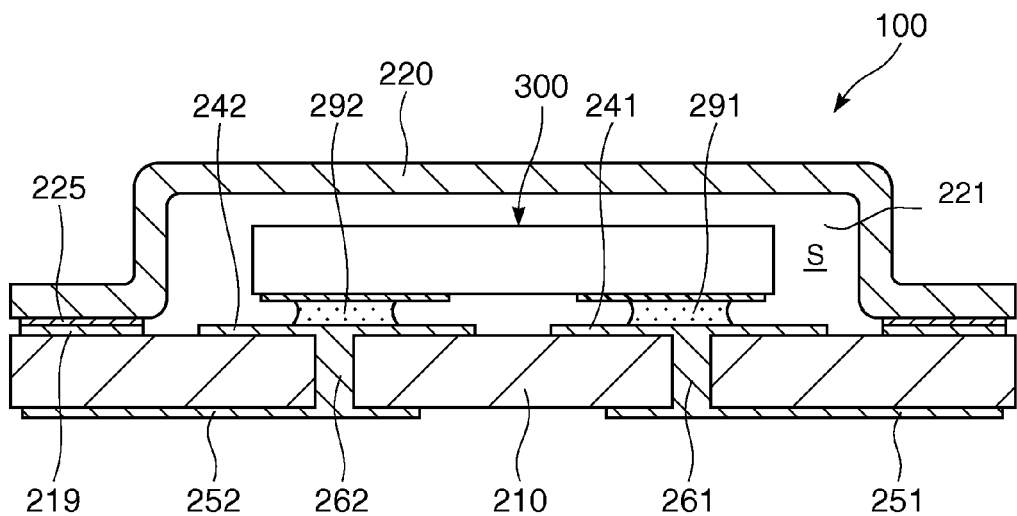

Next, under a reduced-pressure (preferably a vacuum) environment for example, the lid 220 is placed above the base substrate 210 via the brazing material 225 as shown in FIG. 6C, and the brazing material 225 and the metallization layer 219 are melted by, for example, irradiation with a laser, whereby the lid 220 is bonded to the base substrate 210. With this configuration, the electronic device 100 whose inside (the accommodating space S) is airtightly sealed is obtained.

According to the method of manufacturing the electronic device 100, since the through-electrodes 261 and 262 can be covered with "lid" using the electrically conductive adhesives 291 and 292, it is possible to suppress the flow (flow in and flow out) of gas of the accommodating space S via the through-electrodes 261 and 262, so that the airtightness of the accommodating space S can be improved.

Especially, in the embodiment, the electrically conductive adhesives 291 and 292 serve as three members: covering members that cover the through-holes 211 and 212 in plan view of the base substrate 210; fixing members that fix the vibrating element 300 to the base substrate 210; and electrical connection members that electrically connect the connection terminals 241 and 242 with the bonding pads 322 and 332. Therefore, a reduction in the number of parts can be achieved, so that the simplification of the manufacture of the electronic device 100 and a reduction in cost can be achieved.

Second Embodiment

Next, a second embodiment of an electronic device of the invention will be described.

Figure 7:
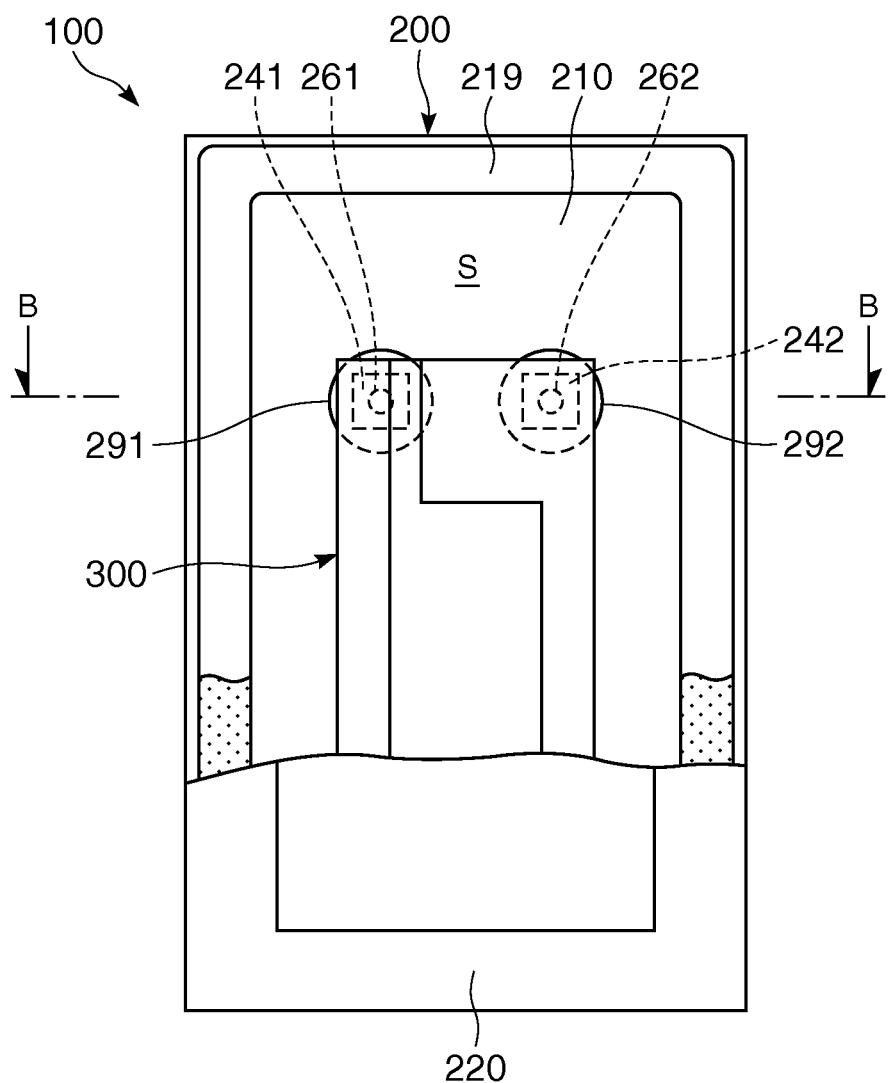
FIG. 7 is a plan view of an electronic device according to a second embodiment of the invention.
Figure 8:
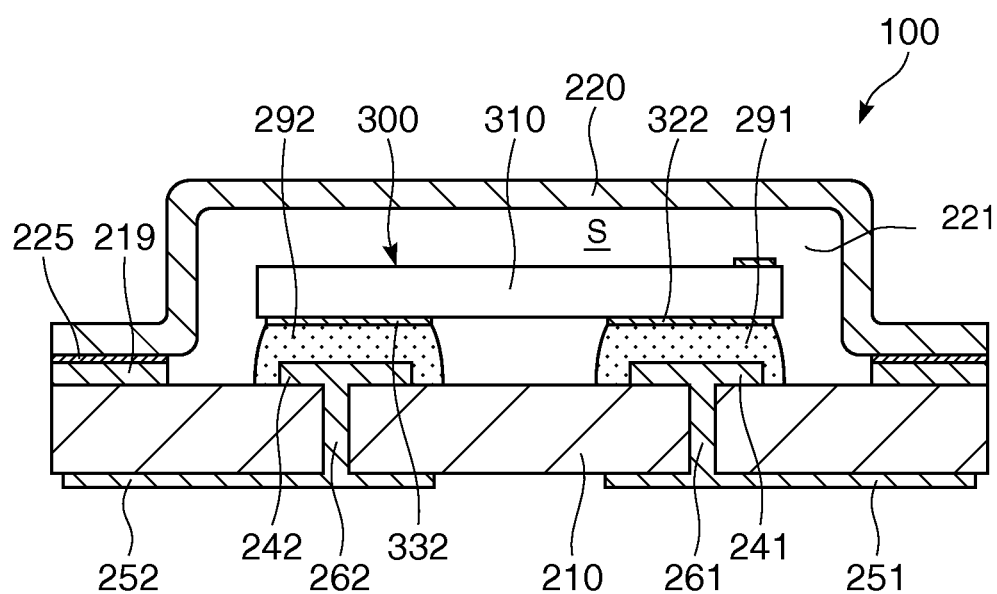
FIG. 8 is a cross-sectional view taken along line B-B in FIG. 7.

FIG. 7 is a plan view of the electronic device according to the second embodiment of the invention; and FIG. 8 is a cross-sectional view taken along line B-B in FIG. 7.

Hereinafter, the electronic device of the second embodiment will be described mainly on differences from the embodiment described above, and the description of similar matters is omitted.

The electronic device of the second embodiment of the invention is similar to that of the first embodiment described above, excepting that the arrangement of the electrically conductive adhesives is different. Configurations similar to those of the embodiment described above are denoted by the same reference signs and numerals.

As shown in FIGS. 7 and 8, in the electronic device 100 of the embodiment, the electrically conductive adhesive 291 is formed to spread from an upper surface of the connection terminal 241 to side surfaces of the connection terminal 241 and the upper surface of the base substrate 210. Therefore, the entire surface region (the upper surface and side surfaces) of the connection terminal 241 and the entire region of a boundary portion between the connection terminal 241 and the base substrate 210 are covered with the electrically conductive adhesive 291.

Similarly, the electrically conductive adhesive 292 is formed to spread from an upper surface of the connection terminal 242 to side surfaces of the connection terminal 242 and the upper surface of the base substrate 210. Therefore, the entire surface region (the upper surface and side surfaces) of the connection terminal 242 and the entire region of a boundary portion between the connection terminal 242 and the base substrate 210 are covered with the electrically conductive adhesive 292.

By covering the entire regions of the connection terminals 241 and 242 with the electrically conductive adhesives 291 and 292 in this manner, it is possible to suppress the flow of gas via the side surfaces of the connection terminals 241 and 242 or the boundary portion between each of the connection terminals 241 and 242 and the base substrate 210, so that the airtightness of the accommodating space S can be further improved compared to the first embodiment described above.

Also according to the second embodiment, advantageous effects similar to those of the first embodiment described above can be provided.

Third Embodiment

Next, a third embodiment of an electronic device of the invention will be described.

Figure 9:
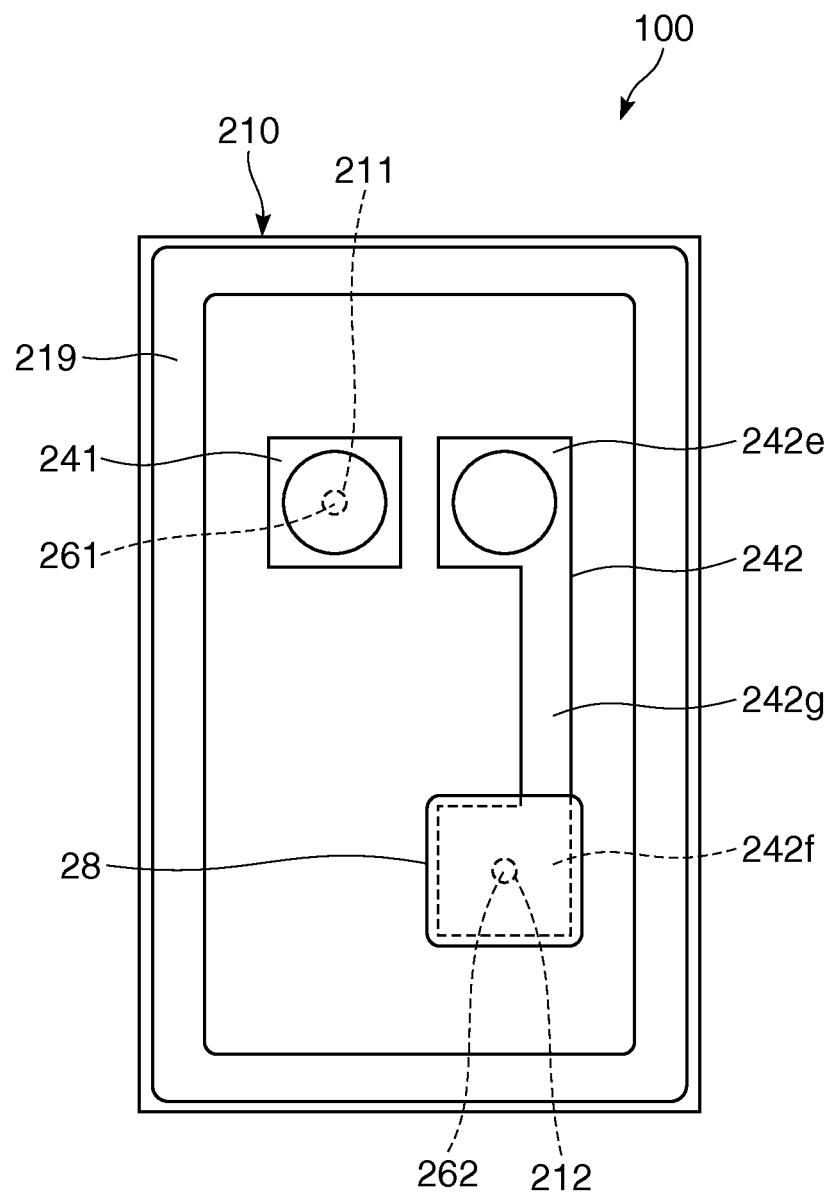
FIG. 9 is a plan view of an electronic device according to a third embodiment of the invention.

FIG. 9 is a plan view of the electronic device according to the third embodiment of the invention. In FIG. 9, the illustration of the lid and the vibrating element is omitted for convenience of description.

Hereinafter, the electronic device of the third embodiment will be described mainly on differences from the embodiment described above, and the description of similar matters is omitted.

The electronic device of the third embodiment of the invention is similar to that of the first embodiment described above, excepting that a covering member and the electrically conductive adhesive are formed separately. Configurations similar to those of the embodiment described above are denoted by the same reference signs and numerals.

In the electronic device 100 shown in FIG. 9, the through-holes 211 and 212 (the through-electrodes 261 and 262) are formed diagonally above the base substrate 210. Therefore, the connection terminal 242 is formed to extend in a long axis direction of the base substrate 210. The connection terminal 242 includes a first portion 242e disposed in parallel with the connection terminal 241, a second portion 242f overlapping with the through-electrode 262, and a third portion 242g connecting the first portion 242e with the second portion 242f.

The electrically conductive adhesive 292 is disposed on the first portion 242e. Via the electrically conductive adhesive 292, the vibrating element 300 is fixed to the base substrate 210, and the connection terminal 242 and the bonding pad 332 are electrically connected. Moreover, a covering member 28 is formed on the second portion 242f. The covering member 28 is formed so as to contain the through-electrode 262 in plan view of the base substrate 210 and formed so as to cover the entire surface region (an upper surface and side surfaces) of the second portion 242f and the entire region of a boundary between the second portion 242f and the base substrate 210.

By covering a certain range of the surrounding area of the through-electrode 262 with the covering member 28 in this manner, it is possible to suppress the flow of gas via the side surfaces of the connection terminal 242 or the boundary portion between the connection terminal 242 and the base substrate 210, so that the airtightness of the accommodating space S can be further improved compared to the first embodiment described above. The "certain range" is preferably a range including at least a portion of the side surfaces of the connection terminal 242 and more preferably a range including a portion of the side surfaces of the connection terminal 242, where a spaced-apart distance between the portion and the through-electrode 262 is shortest, and a boundary portion between the portion and the base substrate 210.

As the covering member 28, a material similar to that of the electrically conductive adhesives 291 and 292 is preferably used. That is, a silver paste is preferably used as the covering member 28. With this configuration, a material can be used in common with the electrically conductive adhesives 291 and 292, so that the simplification of the configuration of the electronic device 100 and a reduction in cost can be achieved. However, the constituent material of the covering member 28 is not particularly limited, and for example, various kinds of resin materials can be used.

Also according to the third embodiment, advantageous effects similar to those of the first embodiment described above can be provided.

Fourth Embodiment

Next, a fourth embodiment of an electronic device of the invention will be described.

Figure 10:
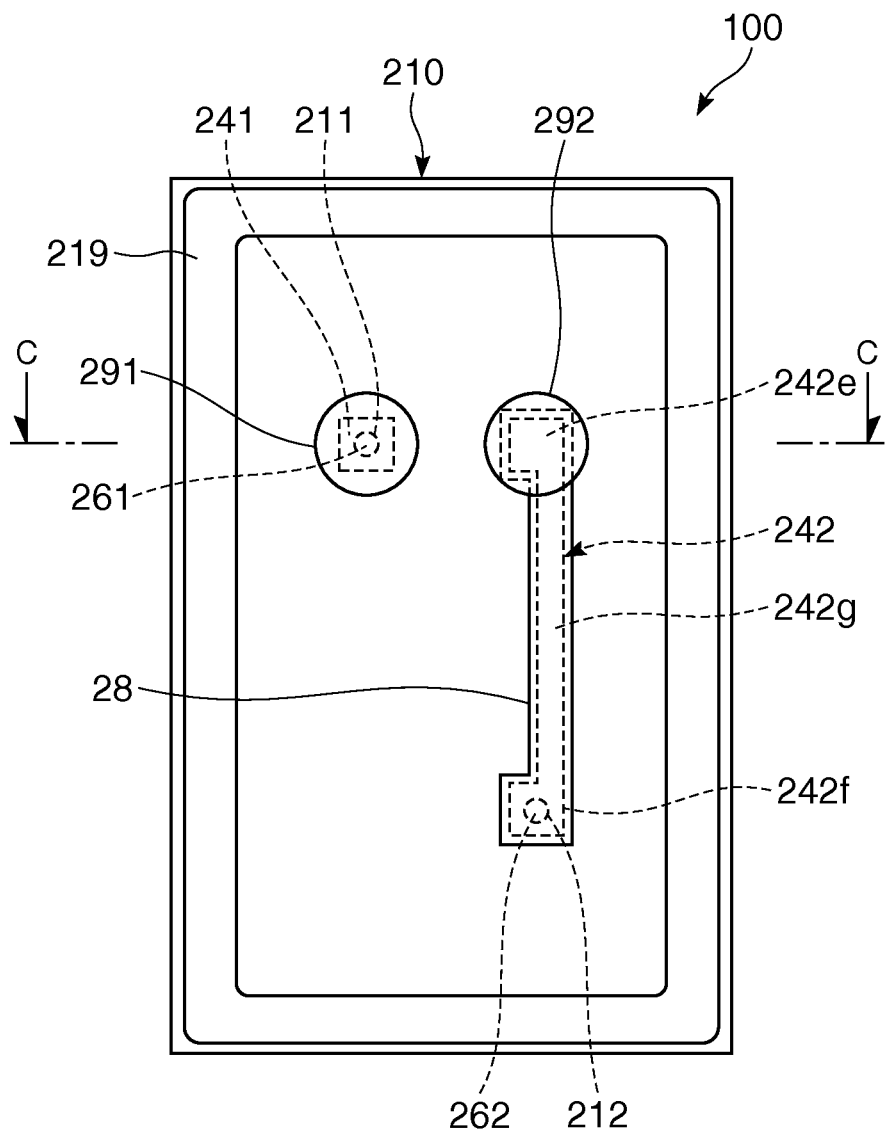
FIG. 10 is a plan view of an electronic device according to a fourth embodiment of the invention.
Figure 11:
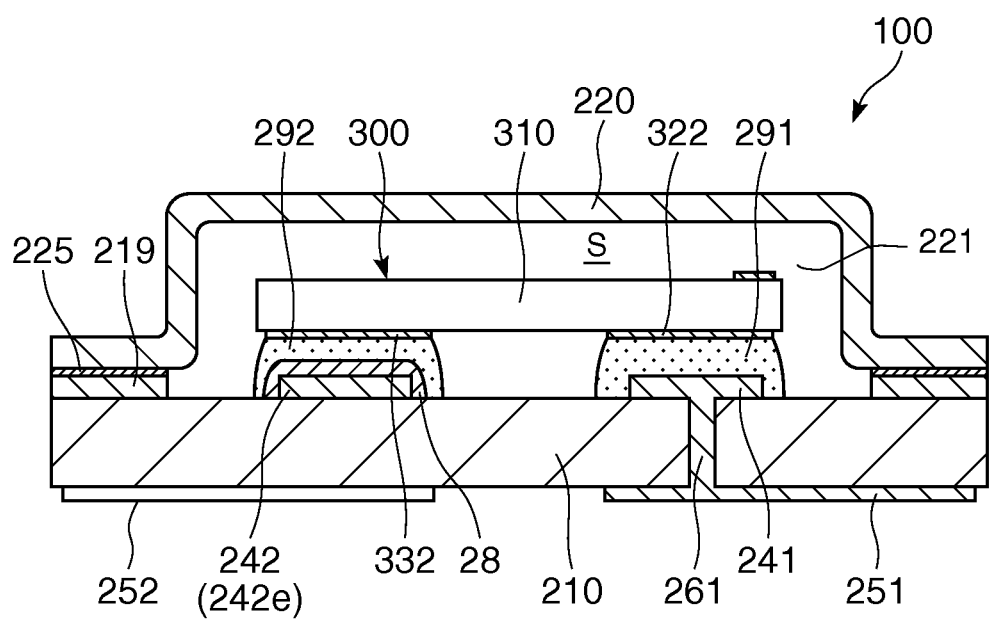
FIG. 11 is a cross-sectional view taken along line C-C in FIG. 10.

FIG. 10 is a plan view of the electronic device according to the fourth embodiment of the invention; and FIG. 11 is a cross-sectional view taken along line C-C in FIG. 10. In FIG. 10, the illustration of the lid and the vibrating element is omitted for convenience of description.

Hereinafter, the electronic device of the fourth embodiment will be described mainly on differences from the embodiment described above, and the description of similar matters is omitted.

The electronic device of the fourth embodiment of the invention is similar to that of the third embodiment described above, excepting that the arrangements (forming regions) of the covering member and the electrically conductive adhesives are different. Configurations similar to those of the embodiment described above are denoted by the same reference signs and numerals.

As shown in FIGS. 10 and 11, the electrically conductive adhesive 291 is disposed so as to cover the entire surface region of the connection terminal 241. Moreover, the covering member 28 is formed so as to cover the entire region of the connection terminal 242, and the electrically conductive adhesive 292 is disposed on the covering member 28. In the configuration described above, the covering member 28 is composed of a material comprising electrical conductivity, so that the electrically conductive adhesive 292 and the connection terminal 242 are electrically connected via the covering member 28. As the covering member 28, a material similar to that of the electrically conductive adhesive 292 is preferably used. With this configuration, the formation of the covering member 28 and the electrically conductive adhesive 292 becomes easy.

Also according to the fourth embodiment, advantageous effects similar to those of the first embodiment described above can be provided.

Fifth Embodiment

Next, a fifth embodiment of an electronic device of the invention will be described.

Figure 12:
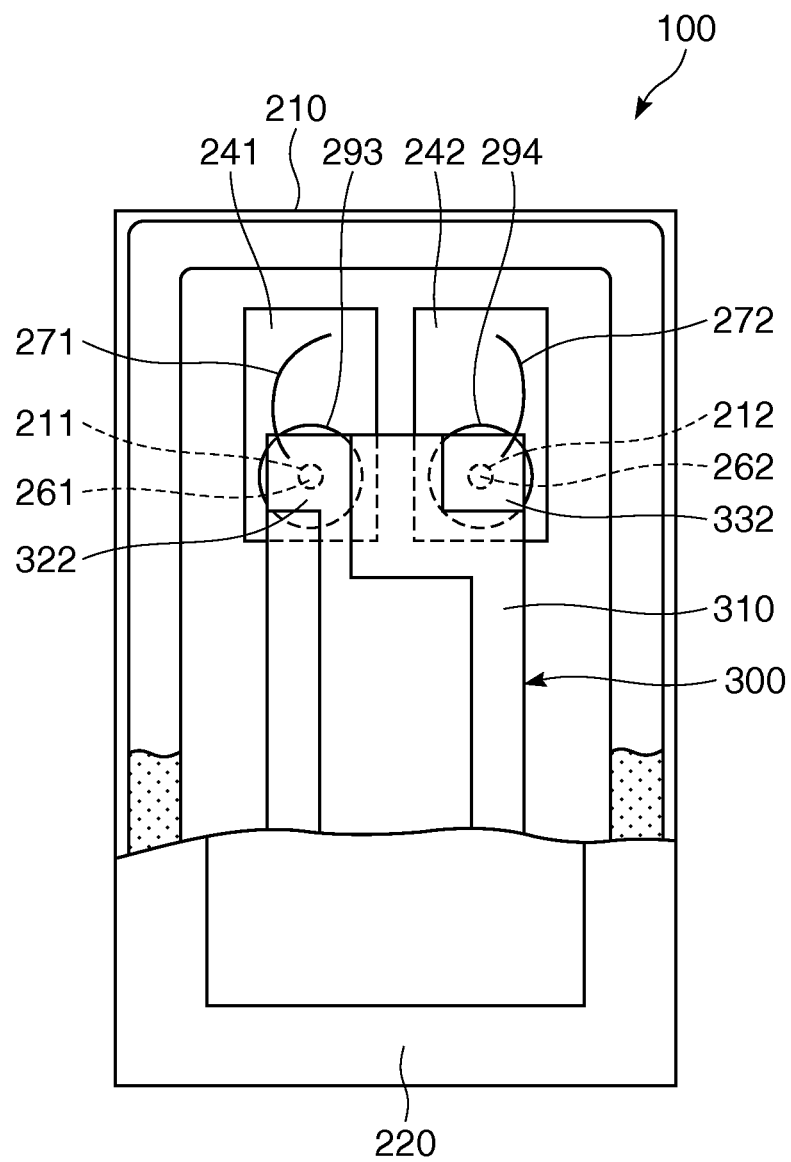
FIG. 12 is a plan view of an electronic device according to a fifth embodiment of the invention.

FIG. 12 is a plan view of the electronic device according to the fifth embodiment of the invention.

Hereinafter, the electronic device of the fifth embodiment will be described mainly on differences from the embodiment described above, and the description of similar matters is omitted.

The electronic device of the fifth embodiment of the invention is similar to that of the first embodiment described above, excepting that a method of electrical connection between the connection terminal and the vibrating element is different, and that a non-electrically conductive adhesive is used instead of an electrically conductive adhesive. Configurations similar to those of the embodiment described above are denoted by the same reference signs and numerals.

As shown in FIG. 12, in the electronic device 100 of the embodiment, the vibrating element 300 is fixed to the base substrate 210 via non-electrically conductive adhesives 293 and 294. Moreover, the adhesives 293 and 294 serve also as covering members. That is, in plan view of the base substrate 210, the adhesive 293 is disposed on the connection terminal 241 so as to contain the through-electrode 261. Similarly, the adhesive 294 is disposed on the connection terminal 242 so as to contain the through-electrode 262. The adhesives 293 and 294 are not particularly limited, and for example, an epoxy resin-based or acrylic resin-based adhesive can be used. The adhesives 293 and 294 may be disposed so as to cover the entire surface regions of the connection terminals 241 and 242.

Moreover, in the electronic device 100 of the embodiment, the bonding pads 322 and 332 are formed on the upper surface of the piezoelectric substrate 310. The connection terminal 241 and the bonding pad 322 are electrically connected through a metal wire (bonding wire) 271, while the connection terminal 242 and the bonding pad 332 are electrically connected through a metal wire 272.

In this manner, with the use of the metal wires 271 and 272, the connections between the connection terminals 241 and 242 and the bonding pads 322 and 332 can be performed more reliably. That is, when the connections are made using the electrically conductive adhesives 291 and 292 as in the embodiment described above, the resistance of the electrically conductive adhesive is changed, depending on the dispersion condition or the like of silver particles in the electrically conductive adhesives 291 and 292, to thereby cause a risk of difficulty in stable connection. However, according to the metal wires 271 and 272, such a problem does not occur.

Also according to the fifth embodiment, advantageous effects similar to those of the first embodiment described above can be provided.

Sixth Embodiment

Next, a sixth embodiment of an electronic device of the invention will be described.

Figure 13:
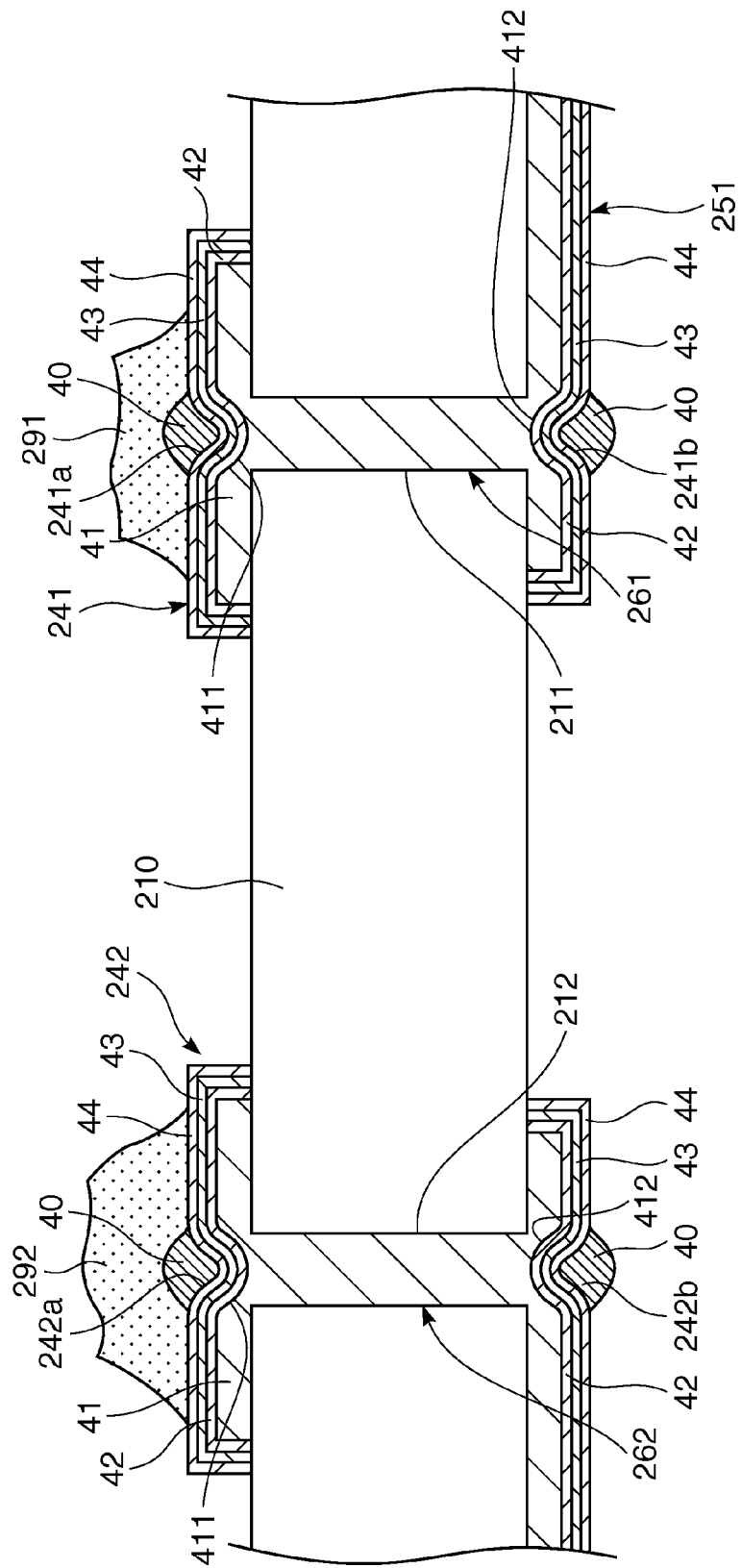
FIG. 13 is a partially enlarged cross-sectional view of an electronic device according to a sixth embodiment of the invention.

FIG. 13 is a partially enlarged cross-sectional view of the electronic device according to the sixth embodiment of the invention.

Hereinafter, the electronic device of the sixth embodiment will be described mainly on differences from the embodiment described above, and the description of similar matters is omitted.

The electronic device of the sixth embodiment of the invention is similar to that of the first embodiment described above, excepting that a plugging member 40 is included. Configurations similar to those of the first embodiment described above are denoted by the same reference signs and numerals.

As described above, the connection terminals 241 and 242, the mounting terminals 251 and 252, and the through-electrodes 261 and 262 can be composed of, for example, the first to fourth metal layers 41 to 44. Here, when the metal ink 900 as the source of the first metal layer 41 is baked, the metal ink 900 shrinks and thus the first metal layer 41 comprising recesses 411 and 412 on and below the through-holes 211 and 212 is sometimes formed as shown in FIG. 13. Then, also in the connection terminals 241 and 242 and the mounting terminals 251 and 252 obtained by stacking and forming the second to fourth metal layers 42 to 44 on the first metal layer 41, recesses 241a, 241b, 242a, and 242b corresponding to the recesses 411 and 412 are formed. At portions where the recesses 241a, 241b, 242a, and 242b are formed, the thickness is reduced by an amount corresponding to the recess, and the strength is also lowered. Therefore, there is a risk of causing the flow in and flow out of gas, especially to and from the accommodating space S via the recesses 241a, 241b, 242a, and 242b.

Therefore, in the electronic device 100 of the embodiment, the plugging member 40 is filled in the recesses 241a, 241b, 242a, and 242b, so that the recesses 241a, 241b, 242a, and 242b are filled. Then, the electrically conductive adhesives 291 and 292 are disposed on the plugging member 40. By adopting the configuration described above, the flow in and flow out of gas via the recesses 241a, 241b, 242a, and 242b can be effectively suppressed.

The constituent material of the plugging member 40 is not particularly limited, and for example, various kinds of resin materials can be used.

Also according to the sixth embodiment, advantageous effects similar to those of the first embodiment described above can be provided.

Seventh Embodiment

Next, a seventh embodiment of an electronic device of the invention will be described.

Figure 14:
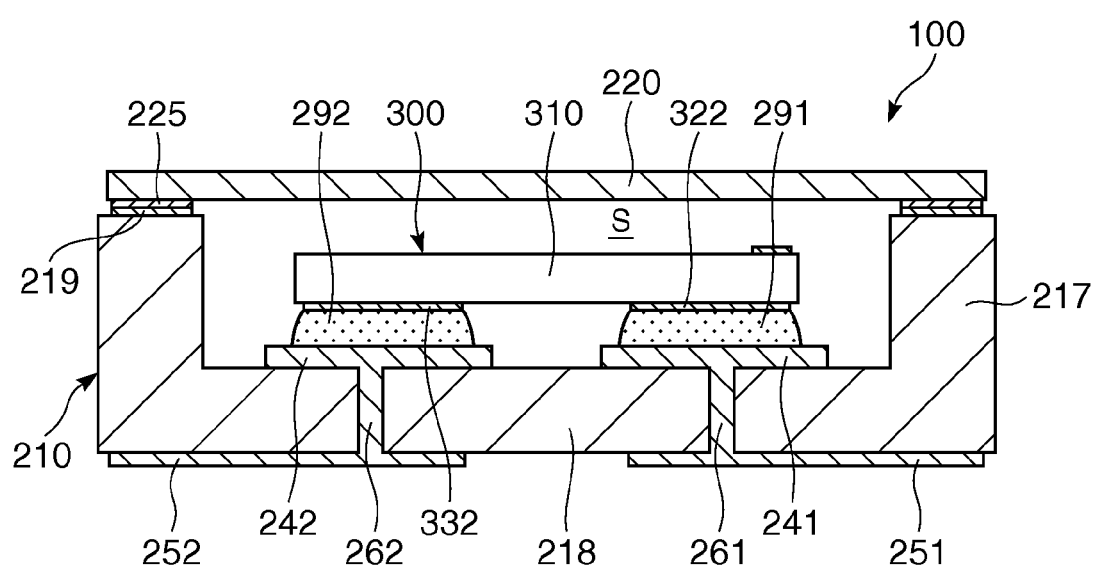
FIG. 14 is a cross-sectional view of an electronic device according to a seventh embodiment of the invention.

FIG. 14 is a cross-sectional view of the electronic device according to the seventh embodiment of the invention.

Hereinafter, the electronic device of the seventh embodiment will be described mainly on differences from the embodiment described above, and the description of similar matters is omitted.

The electronic device of the seventh embodiment of the invention is similar to that of the first embodiment described above, excepting that the configuration of the package, specifically, the shapes of the base substrate and the lid are different. Configurations similar to those of the embodiment described above are denoted by the same reference signs and numerals.

In the electronic device 100 shown in FIG. 14, the base substrate 210 is of a cavity type in which a recess that is opened in the upper surface is provided, and the lid 220 has a plate shape. Then, the lid 220 is bonded on the upper surface (opening edge surface) of the base substrate 210 so as to cover an opening of the recess of the base substrate 210.

The base substrate 210 has a plate-like bottom portion 218 and a frame-like side wall 217 erected from the periphery of the bottom portion. For example, the side wall 217 may be formed of a single-layered (one) green sheet, or the side wall 217 may be formed of a plurality of stacked green sheets.

Also according to the seventh embodiment, advantageous effects similar to those of the first embodiment described above can be provided.

Electronic Apparatuses

Next, electronic apparatuses (electronic apparatuses of the invention) to which the electronic device of the invention is applied will be described in detail based on FIGS. 15 to 17.

Figure 15:
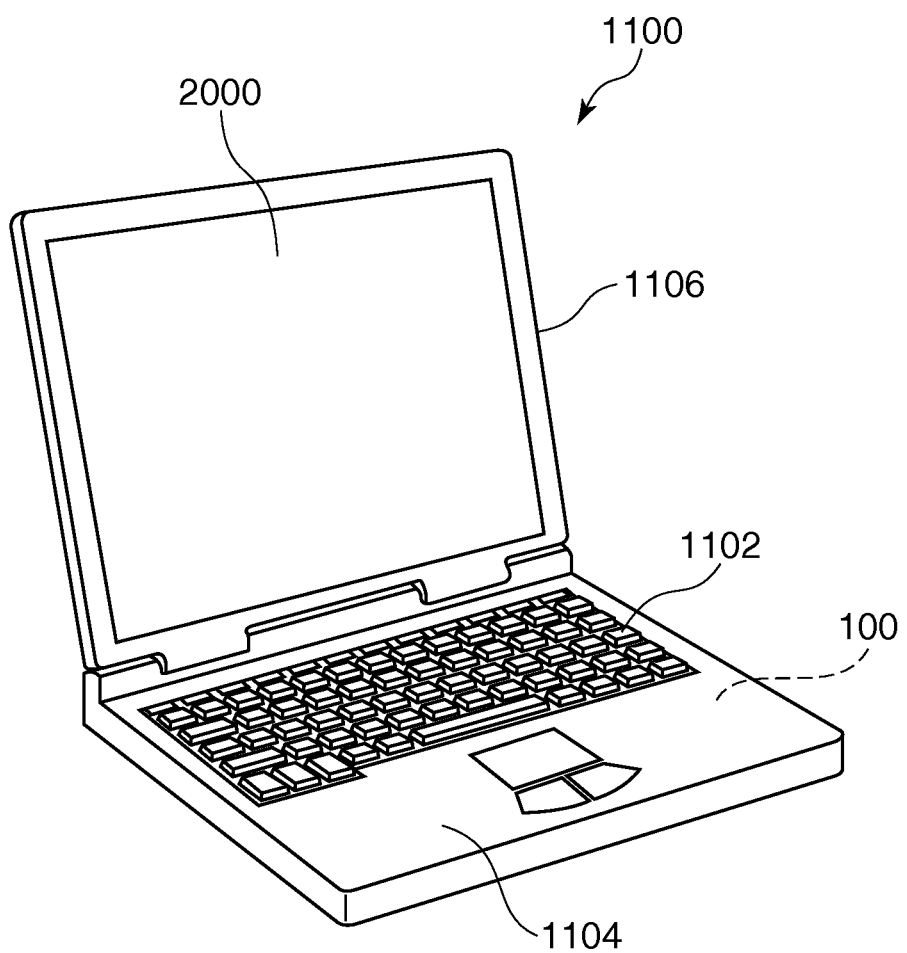
FIG. 15 is a perspective view showing the configuration of a mobile (or notebook) personal computer to which an electronic apparatus including the electronic device of the invention is applied.

FIG. 15 is a perspective view showing the configuration of a mobile (or notebook) personal computer to which an electronic apparatus including the electronic device of the invention is applied. In the drawing, the personal computer 1100 includes a main body portion 1104 including a keyboard 1102 and a display unit 1106 comprising a display portion 2000. The display unit 1106 is rotationally movably supported relative to the main body portion 1104 via a hinge structure portion. In the personal computer 1100, the electronic device 100 functioning as a filter, a resonator, a reference clock, or the like is incorporated.

Figure 16:
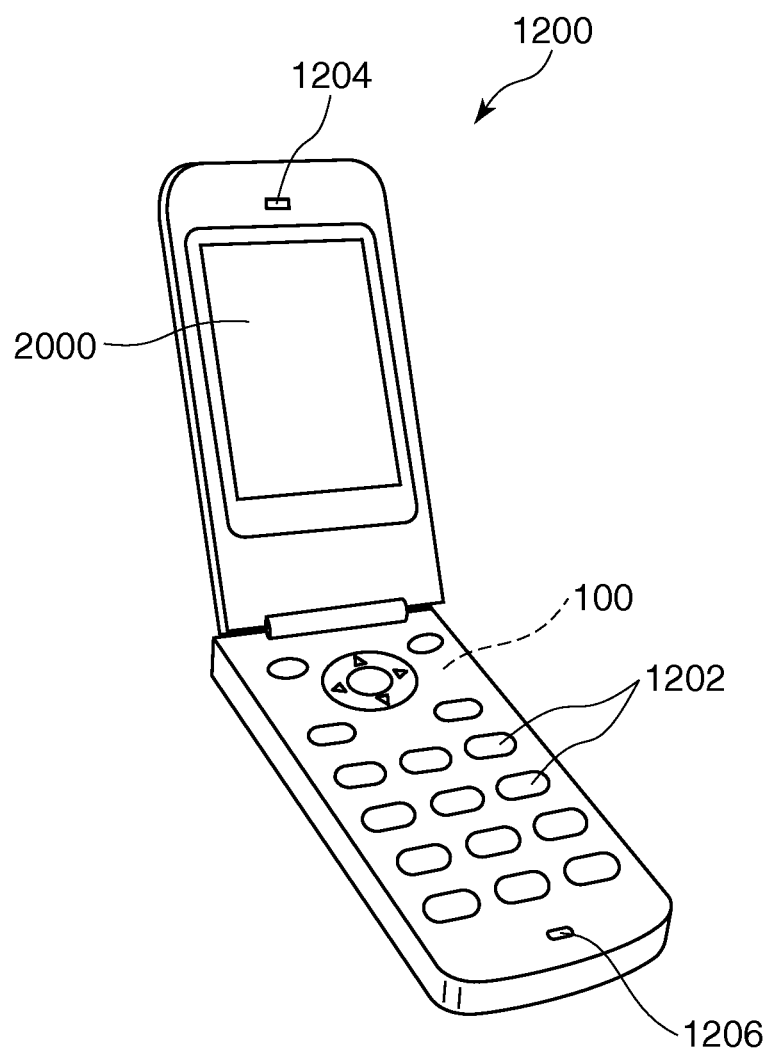
FIG. 16 is a perspective view showing the configuration of a mobile phone (including a PHS) to which an electronic apparatus including the electronic device of the invention is applied.

FIG. 16 is a perspective view showing the configuration of a mobile phone (including a PHS) to which an electronic apparatus including the electronic device of the invention is applied. In the drawing, the mobile phone 1200 includes a plurality of operation buttons 1202, an earpiece 1204, and a mouthpiece 1206. A display portion 2000 is arranged between the operation buttons 1202 and the earpiece 1204. In the mobile phone 1200, the electronic device 100 functioning as a filter, a resonator, or the like, is incorporated.

Figure 17:
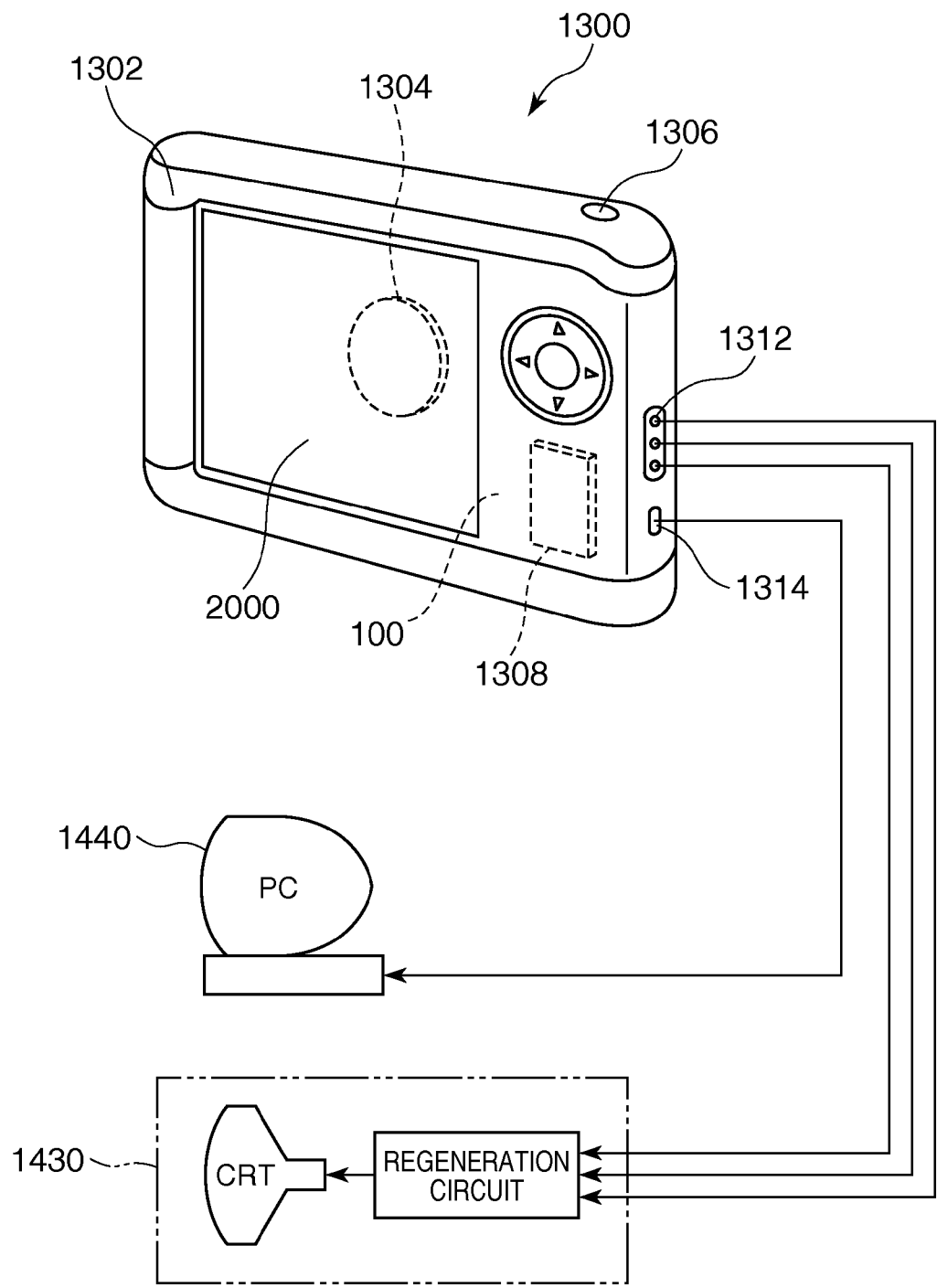
FIG. 17 is a perspective view showing the configuration of a digital still camera to which an electronic apparatus including the electronic device of the invention is applied.

FIG. 17 is a perspective view showing the configuration of a digital still camera to which an electronic apparatus including the electronic device of the invention is applied. In the drawing, connections with external apparatuses are also shown in a simplified manner. Here, usual cameras expose a silver halide photographic film with an optical image of a subject, whereas the digital still camera 1300 photoelectrically converts an optical image of a subject with an imaging element such as a CCD (Charge Coupled Device) to generate imaging signals (image signals).

A display portion is disposed on the back surface of a case (body) 1302 in the digital still camera 1300 and configured to perform display based on imaging signals generated by a CCD. The display portion functions as a finder that displays a subject as an electronic image. Moreover, on the front side (the rear side in the drawing) of the case 1302, a light receiving unit 1304 including an optical lens (imaging optical system) and a CCD is disposed.

When a photographer confirms a subject image displayed on the display portion and presses down a shutter button 1306, imaging signals of a CCD at the time are transferred to and stored in a memory 1308. Moreover, in the digital still camera 1300, a video signal output terminal 1312 and a data communication input/output terminal 1314 are disposed on the side surface of the case 1302. Then, as shown in the drawing, a television monitor 1430 and a personal computer 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation. In the digital still camera 1300, the electronic device 100 functioning as a filter, a resonator, or the like is incorporated.

An electronic apparatus including the electronic device of the invention can be applied to for example, in addition to the personal computer (mobile personal computer) of FIG. 15, the mobile phone of FIG. 16, and the digital still camera of FIG. 17, inkjet ejection apparatuses (for example, inkjet printers), laptop personal computers, television sets, video camcorders, video tape recorders, car navigation systems, pagers, electronic notebooks (including those with communication function), electronic dictionaries, calculators, electronic gaming machines, word processors, workstations, videophones, surveillance television monitors, electronic binoculars, POS terminals, medical equipment (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, and ships), flight simulators, and the like.

Although the electronic devices, the method of manufacturing the electronic device, and the electronic apparatuses of the invention have been described so far based on the illustrated embodiments, the invention is not limited to them. The configuration of each of the portions can be replaced with any configuration comprising a similar function. Moreover, any other constituent may be added to the invention. Moreover, each of the embodiments may be appropriately combined.

The entire disclosure of Japanese Patent Application No. 2012-089669, filed Apr. 10, 2012 is expressly incorporated by reference herein.

What is claimed is:

1. An electronic device comprising:
an electronic component;
a base substrate comprising the electronic component fixed above one of surface sides;
a lid portion bonded to the base substrate so as to cover the electronic component;
a connection terminal formed above a surface of the base substrate above the electronic component side and electrically connected with the electronic component;
a through-electrode formed to penetrate the base substrate in a thickness direction thereof and electrically connected with the connection terminal, wherein the through-electrode is formed in a through-hole of the base substrate; and
a covering member formed above the connection terminal so as to contain the through-electrode in plan view of the base substrate, wherein the covering member completely covers the through-electrode and through-hole of the base substrate in plan view.

2. The electronic device according to claim 1, wherein the covering member further covers at least a portion of a side surface of the connection terminal.

3. The electronic device according to claim 2, wherein the covering member covers at least a side surface of the connection terminal, where a spaced-apart distance between the side surface and the through-electrode is shortest.

4. The electronic device according to claim 1, wherein the electronic component is fixed to the base substrate via the covering member.

5. The electronic device according to claim 4, wherein the connection terminal and the electronic component are electrically connected via the covering member having electrical conductivity.

6. The electronic device according to claim 4, further comprising a wire electrically connecting the connection terminal with the electronic component.

7. An electronic apparatus comprising the electronic device according to claim 1.

8. An electronic apparatus comprising the electronic device according to claim 2.

9. A method of manufacturing an electronic device, comprising:
preparing a base substrate formed with a connection terminal and a through-electrode that penetrates in a thickness direction and is electrically connected with the connection terminal, wherein the through-electrode penetrates through a through-hole formed in the base substrate;
arranging a covering member on the connection terminal;
fixing an electronic component above the base substrate via the covering member; and
bonding a lid portion to the base substrate so as to cover the electronic component, wherein
in the fixing of the electronic component on the base substrate, the covering member contains an end of the through-electrode on the connection terminal side in plan view of the base substrate and the covering member completely covers the through-electrode and through-hole of the base substrate in plan view.

* * * * *